(12) United States Patent
Park

(10) Patent No.: US 7,495,206 B2
(45) Date of Patent: Feb. 24, 2009

(54) IMAGE SENSOR WITH STACKED AND BONDED PHOTO DETECTION AND PERIPHERAL CIRCUIT SUBSTRATES

(75) Inventor: Sang-Kyun Park, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 11/321,772

(22) Filed: Dec. 28, 2005

(65) Prior Publication Data
US 2006/0146233 A1 Jul. 6, 2006

(30) Foreign Application Priority Data
Dec. 30, 2004 (KR) .............. 10-2004-0115972

(51) Int. Cl.
*H01L 31/00* (2006.01)
(52) U.S. Cl. .............. 250/214.1; 257/292; 257/293; 438/67; 438/74; 438/668
(58) Field of Classification Search ............. 250/214.1; 257/292, 293; 438/67, 74, 668
See application file for complete search history.

(56) References Cited

U.S. PATENT DOCUMENTS

| | | | |
|---|---|---|---|
| 6,169,319 B1* | 1/2001 | Malinovich et al. | 257/447 |
| 6,380,572 B1* | 4/2002 | Pain et al. | 257/292 |
| 6,927,432 B2* | 8/2005 | Holm et al. | 257/290 |
| 2002/0027261 A1* | 3/2002 | Besser et al. | 257/584 |
| 2003/0209652 A1* | 11/2003 | Fujii et al. | 250/214.1 |
| 2003/0211405 A1 | 11/2003 | Venkataraman | |
| 2003/0218120 A1* | 11/2003 | Shibayama | 250/214.1 |
| 2003/0222204 A1* | 12/2003 | Gidon et al. | 250/214.1 |
| 2005/0121599 A1* | 6/2005 | Mouli | 250/208.1 |
| 2006/0199296 A1* | 9/2006 | Sekiguchi et al. | 438/48 |

FOREIGN PATENT DOCUMENTS

| EP | 1453097 A1 | 1/2004 |
|---|---|---|
| KR | 10-2004-0115972 | 12/2004 |

* cited by examiner

*Primary Examiner*—Seung C Sohn
(74) *Attorney, Agent, or Firm*—DLA Piper LLP US

(57) ABSTRACT

A complementary metal oxide semiconductor (CMOS) device with a three dimensional integration structure and a method for fabricating the same are provided. An image sensor includes a first substrate in which a photo detection device is formed; a second substrate in which a peripheral circuit is formed, wherein the first substrate and the second substrate are bonded through a plurality of bonding pads formed on both the first substrate and the second substrate, and a back side of the first substrate is turned upside down; and a microlens formed on a top portion of the back side of the first substrate.

18 Claims, 6 Drawing Sheets

IMAGE SENSOR WITH STACKED AND BONDED PHOTO DETECTION AND PERIPHERAL CIRCUIT SUBSTRATES

FIELD OF THE INVENTION

The present invention relates to an image sensor; and more particularly, to a complementary metal oxide semiconductor (CMOS) device with a three dimensional integration structure and a method for fabricating the same.

DESCRIPTION OF RELATED ARTS

Image sensors are semiconductor devices converting optical images into electrical signals. Among the image sensors, a charge coupled device (CCD) is a device which electric charge carriers are stored in and transferred to the capacitors as individual metal-oxide-silicon (MOS) capacitors are closely located with each other.

Meanwhile, a complementary metal-oxide-silicon (CMOS) image sensor uses a CMOS technology using a control circuit and a signal processing circuit as a peripheral circuit. The CMOS image sensor adopts a switching method which makes MOS transistors as many as the number of pixels and uses the MOS transistors and thus, the CMOS image sensor sequentially detects an output.

FIG. 1 is a block diagram illustrating a chip lay-out of a conventional CMOS image sensor.

Referring to FIG. 1, a pixel array unit 10 is placed in the center. A row driver 15 and a column driver 14 are placed in the directions of a row and column of pixel array unit 10, respectively. A correlated data sampling (CDS) unit 13 is placed between the pixel array unit 10 and the column driver 14. An analog to digital converter (ADC) 11 and a programmable gain amplifier (PGA) 12 are placed in portions opposite to the row driver 15 in the direction of the row of the pixel array unit 10. A digital control block 16 is also placed in not only a lateral portion of the row driver 15 but also an upper portion of the pixel array unit 10. A plurality of pads, 17, e.g., Y[0:7], DVDD, DGND, MCLK, VCLK, HSYNC, VSYNC, SDA, SDK, VDDA, GNDA, STROBE, RESETE, ENV, C[0:7], are placed along the outside of the Chip, and each of the pads 17 is connected to each block.

In the structure shown in FIG. 1, if the pixel array unit 10 is considered as a photo detection area, remaining regions except the pixel array unit 10 are considered as a peripheral region. An area of the pixel array unit 10 per chip area is limited to approximately 40% due to constitution of the chip shown in FIG. 1.

Furthermore, a pixel size is decreased to obtain a high quality and accordingly, an amount of the light received by a photo detection device is decreased. The decreased amount of the light increases image loss resulted from a noise increase, thereby degrading an image.

FIG. 2 is a cross-sectional view briefly illustrating a conventional unit pixel.

Referring to FIG. 2, a field oxide layer FOX is locally formed in a substrate SUB formed by stacking a highly doped $P^{++}$-type region and a P-type epitaxial layer, and a plurality of transistors TR including a transfer transistor (not shown) are formed on the substrate SUB. For instance, a photodiode PD comprised of an N-type region (not shown) formed by perfuming a deep ion-implantation into a lower portion of the substrate SUB aligned with one side of the transfer gate and a P-type region (not shown) placed in a region contacted with the substrate (SUB) is formed. Although not shown, a highly doped $N^+$-type floating diffusion region is formed through an ion-implantation in the lower portion of the substrate SUB aligned with the other side of the transfer gate.

A pre-metal dielectric layer (not shown) before forming a metal line, a first metal line M1, a second metal line M2, and an inter-metal dielectric layer IMD are formed an entire surface of the resulting structure.

The first metal line M1 and the second metal line M2 are formed to serve a role in connecting a power line or a signal line with a unit pixel and a logic circuit. Also, the first metal line M1 and the second metal line M2 serves another role as a shield to prevent the light from coming into a region other than the photodiode PD.

Furthermore, although the second metal line M2 is shown as the last metal line herein, there may be other cases including metal lines more than two.

A passivation layer PL to protect a lower structure is formed on the second metal line M2. A first over coating layer OCL1 is formed on the passivation layer PL to reduce a height difference generated along the second metal line M2. Herein, the passivation layer PL typically has a dual structure of a nitride layer and an oxide layer.

A color filter array to embody red, green, and blue colors according to each unit pixel is formed on the first over coating layer OCL1.

Typical primary colors which are red, green, and blue colors are used; however, complementary colors which are yellow, magenta, and cyan colors can be used.

A second over coating layer OCL2 for securing a process margin during forming a microlens is formed on the color filter array CFA.

A microlens ML is formed on the second over coating layer OCL2 and a passivation is formed on the microlens ML to prevent a scratch or a damage on the microlens ML. However, the passivation on the microlens ML is not shown.

As described in FIG. 2, since a portion detecting the light within in one pixel is not occupied in a whole space of the one pixel, a portion which a photo detection region occupies with respect to a chip area of an image sensor is much more decreased.

SUMMARY OF THE INVENTION

It is, therefore, an object of the present invention to provide an image sensor capable of maximizing a photo detection region within an image sensor chip, and a method for fabricating the same.

In accordance with one aspect of the present invention, there is provided an image sensor, including: a first substrate in which a photo detection device is formed; a second substrate in which a peripheral circuit is formed, wherein the first substrate and the second substrate are bonded through a plurality of bonding pads formed on both the first substrate and the second substrate, and a back side of the first substrate is turned upside down; and a microlens formed on a top portion of the back side of the first substrate.

In accordance with another aspect of the present invention, there is provided a method for fabricating an image sensor, including: forming a first insulation layer inside a first substrate; forming an epitaxial layer on the first insulation layer; forming a photodiode within the epitaxial layer; forming a transfer transistor in the epitaxial layer adjacent to the photodiode; forming a plurality of first bonding pads on upper portions of the transfer transistor; forming a plurality of transistors on a second substrate; forming a plurality of connection units expanded to the inside of the second substrate; forming a plurality of second bonding pads connected to the connection units; bonding the second substrate and the first substrate together to make the first bonding pads and the second bonding pads be faced with each other; forming an input/output pad to be connected to the connection units in a back side of the second substrate; removing a back side of the first substrate to expose the first insulation layer in the back side of the first substrate; and forming a microlens on the first insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

Figure 1:
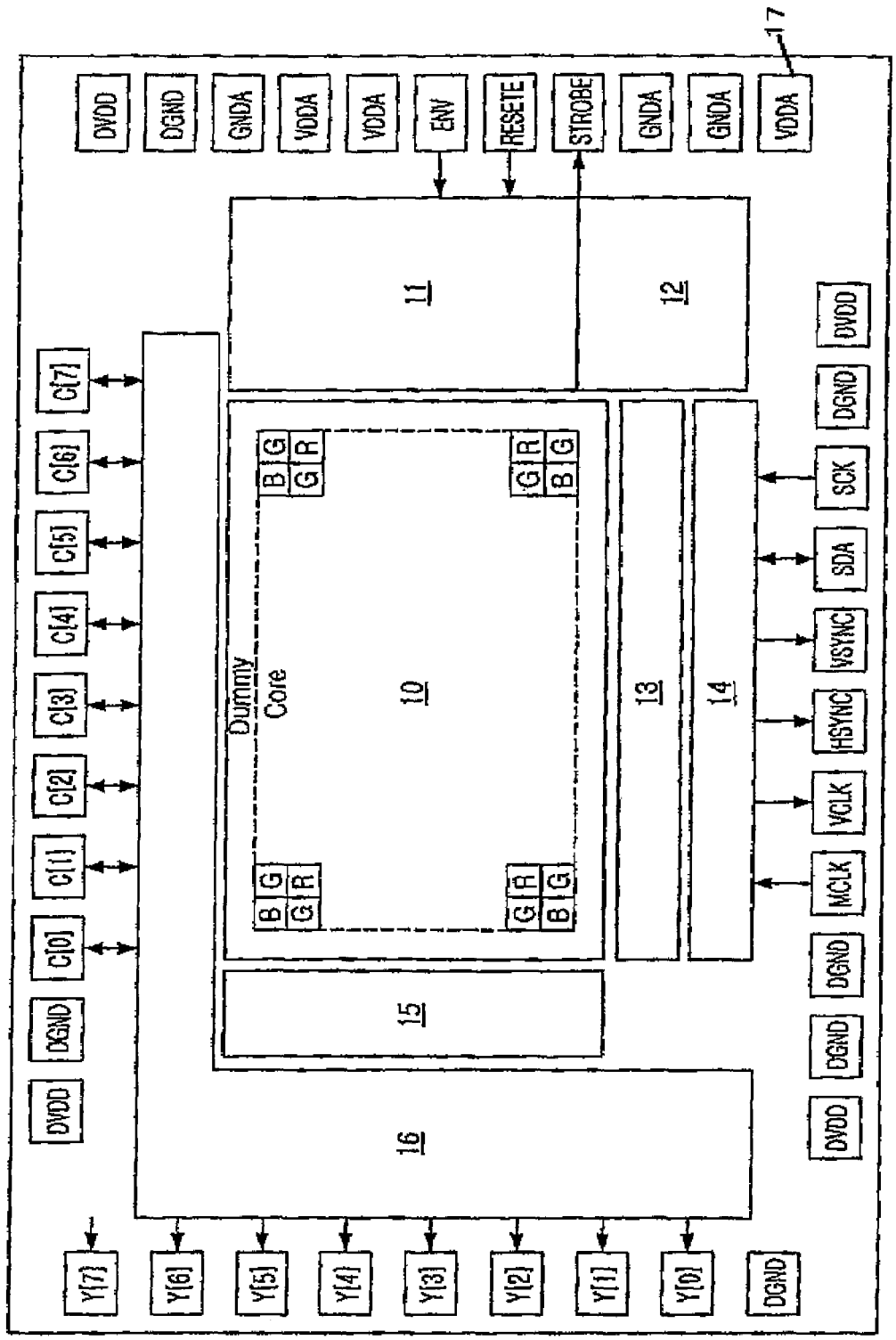
FIG. 1 is a block diagram illustrating a chip lay-out of a conventional complementary metal oxide semiconductor (CMOS) image sensor.
Figure 2:
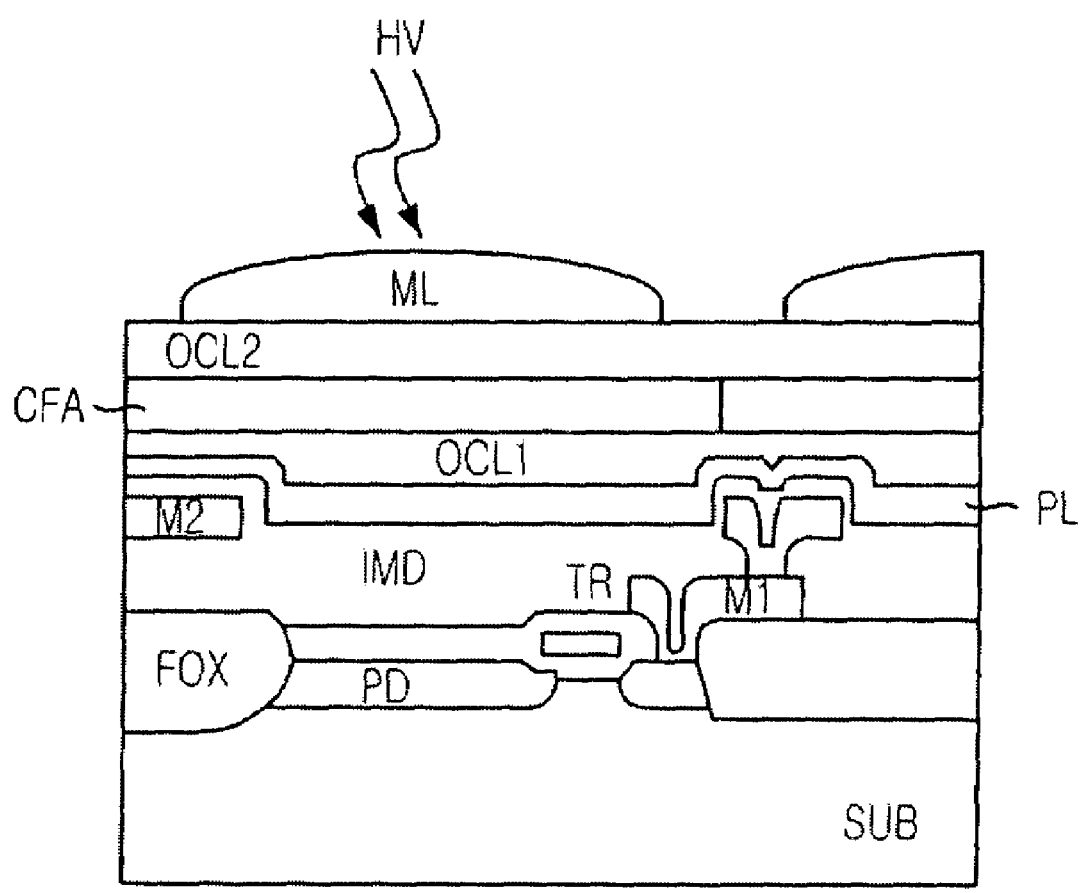
FIG. 2 is a cross-sectional view briefly illustrating a conventional unit pixel.
Figure 3:
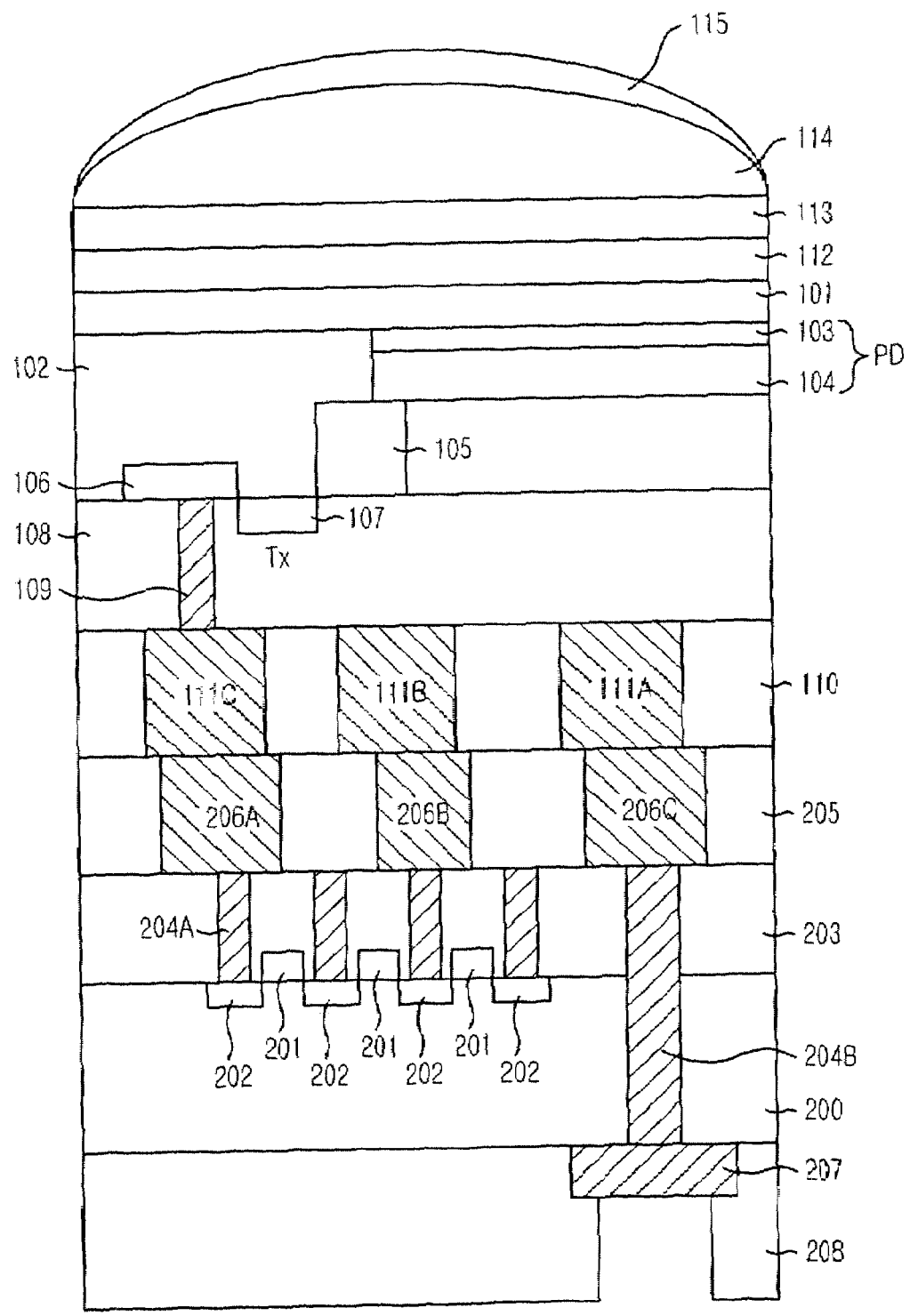
FIG. 3 is a cross-sectional view illustrating a unit pixel of an image sensor in accordance with a specific embodiment of the present invention.

FIG. 3 is a cross-sectional view illustrating a unit pixel of an image sensor in accordance with a specific embodiment of the present invention.

The CMOS image sensor includes a third insulation layer 101 embodied in a silicon-on-insulator (SOI) structure; a color filter array (CFA) 112 provided on the third insulation layer 101; an over coating layer 113 provided on the color filter array 112; a microlens (ML) 114 formed on the over coating layer 113; a lens passivation layer 115 formed on the microlens 114; a photodiode PD formed with two different conductive regions 103 and 104 beneath the third insulation layer 101; an impurity region 105 contacted with the conductive region 104 which is a lower portion of the photodiode PD, i.e., a source region, and an impurity region 106 placed apart from the impurity region 105; and a gate electrode 107 using the impurity regions 105 and 106 as a source/drain. The gate electrode 107, and the impurity regions 105 and 106 form a transfer transistor Tx. The photodiode PD, and the impurity regions 105 and 106 are placed on an epitaxial layer 102.

In a lower portion of the transfer transistor Tx, a second insulation layer 108 is formed, and a connection unit 109 electrically connected to the impurity region 106 is formed by penetrating the second insulation layer 108. A first insulation layer 110 is formed beneath the second insulation layer 108 and the connection unit 109. A plurality of metal lines 111A to 111C connected to the connection unit 109 are formed by penetrating a first insulation layer 110.

A region from the first insulation layer 110 to the microlens 114 denotes a photo detection region, and the photo detection region is placed in almost whole chip.

Meanwhile, a peripheral circuit operating the photo detection device is integrated through another second substrate 200 and the peripheral circuit is connected to the photo detection device through a plurality of metal lines 206A to 206C facing the metal lines 111A to 111C of the photo detection device.

The peripheral circuit includes a plurality of gate electrodes 201 formed on the substrate 200; a plurality of source/drain regions 202 placed in lower portions of the substrate 200 to be aligned with the gate electrodes 201; a first insulation layer 203 formed on the gate electrodes 201; and a plurality of first connection units 204A connected to the source/drain regions 202 by penetrating the first insulation layer 203. The first connection units 204A are connected to the metal lines 206A to 206C, and the metal lines 206A to 206C are surrounded by a second insulation layer 205.

Through a second connection unit 204B penetrating the first insulation layer 203 and the second substrate 200, the metal line 206C and a pad 207 are placed in an opposite direction. The pad 207 is surrounded by a passivation layer 208.

The photo detection device and the peripheral circuit are formed in two separate substrates, respectively. Afterwards, the substrate in which the photo detection device is formed is turned upside down to make a region adjacent to the photodiode PD placed in a front side and then, is integrated in three-dimensional with the substrate in which the peripheral circuit is formed. Thereafter, the color filter array and the microlens are formed in portions adjacent to the photodiode PD and then, the pad is formed in an opposite side of the photodiode PD. Thus, the structure shown in FIG. 3 is completed.

Accordingly, it is possible to form the photo detection device in a whole chip, thereby reducing a decrease in a photo detection area resulted from a decreased pixel size and the resulting degradation of image.

FIGS. 4A to 4D are cross-sectional views illustrating a fabrication process of a complementary metal oxide semiconductor (CMOS) image sensor in accordance with a specific embodiment of the present invention.

Figure 4A:
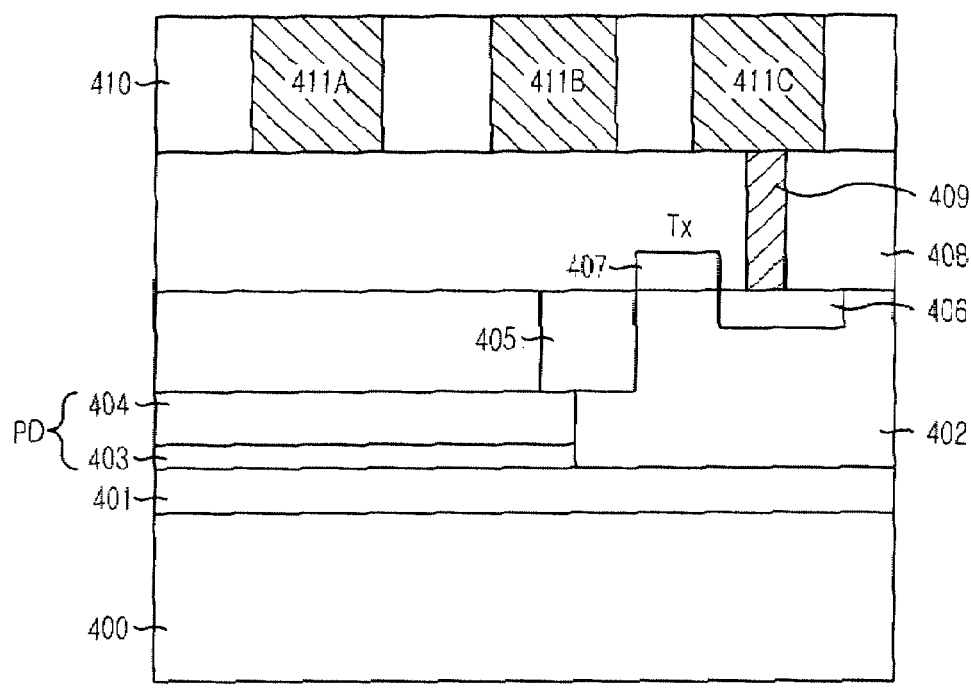
FIGS. 4A to 4D are cross-sectional views illustrating a fabrication process of a CMOS image sensor in accordance with a specific embodiment of the present invention.

As shown in FIG. 4A, a first insulation layer 401 is formed inside a first substrate 400 to make the first substrate 400 have a silicon-on-insulator (SOI) structure. The first insulation layer 401 is formed in a thickness ranging from approximately 0.3 µm to approximately 10 µm by using an oxide based layer.

Through an epitaxial growth process, an epitaxial layer 402 is formed on the first insulation layer 401 of the first substrate 400. The epitaxial layer is formed in a thickness ranging from approximately 0.3 µm to approximately 10 µm.

Hereinafter, the epitaxial layer 402 with a P-type conductive type is exemplified in the specific embodiment of the present invention.

A photodiode PD with a stacked structure of a P-type conductive region 403 and an N-type conductive region 404 is formed on the epitaxial layer 402. The P-type conductive region 403 and the N-type conductive region 404 can be formed by using an ion-implantation process, or a deposition and a growth process.

It is preferable that the P-type conductive region 403 is formed in a thickness ranging from approximately 50 Å to approximately 1,000 Å.

A gate electrode 407 is formed on the epitaxial layer 402, and impurity regions 405 and 406 of a source/drain are formed in upper portions of the epitaxial layer 402 on both sides of the gate electrode 407.

To transfer photoelectric charges generated from the photodiode PD, a portion of the N-type conductive region 404 and a portion of the impurity region 405 are overlapped.

The gate electrode 407 and the impurity regions 405 and 406 comprise a transfer transistor Tx serving a role in transferring the photoelectric charges generated from the photodiode PD to the impurity region 406 serving a role as a floating diffusion region.

A second insulation layer 408 is formed on the transfer transistor Tx. The second insulation layer 408 is an oxide based insulation layer.

The second insulation layer 408 is selectively etched, thereby exposing the impurity region 406. Afterwards, a connection unit 409 electrically connected to the impurity region 406 is formed.

The connection unit 409 is formed to transfer the photoelectric charges accumulated in the impurity region 406 serving a role as the floating diffusion region to a peripheral circuit unit.

The connection unit 409 is formed by using titanium (Ti), titanium nitride (TiN), titanium tungsten (TiW), W plug, and a combination thereof in a thickness ranging from approximately 100 Å to approximately 1,000 Å.

A plurality of cupper (Cu) bonding pads 411A to 411C electrically connected to the connection unit 409 and connected to the peripheral circuit unit are formed to be surrounded by a third insulation layer 410 on the connection unit 409.

The Cu bonding pads 411A to 411C are formed in a thickness ranging from approximately 0.3 µm to approximately 2.0 µm.

The Cu bonding pads 411A to 411C can be formed by using a damascene process or a typical lithography process.

Through FIG. 4A, a fabrication process of a photo detection device before a three-dimensional integration is completed.

Figure 4B:
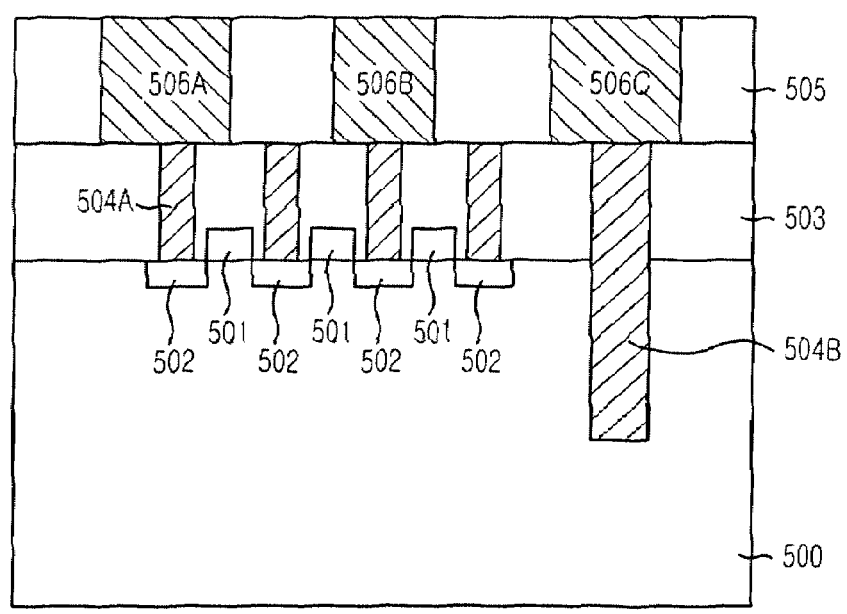

Next, as shown in FIG. 4B, a fabrication process of a peripheral circuit unit before a three-dimensional integration is performed.

Various constitution elements comprising the peripheral circuit unit is formed on a second substrate 500; however, herein a transistor is only shown.

A plurality of gate electrodes 501 are formed on the second substrate 500 and afterwards, a plurality of impurity regions 502 such as source/drains are formed beneath a surface of the second substrate 500 to be aligned with the gate electrodes 501.

A first insulation layer 503 is formed on the entire surface of the second substrate 500 completed with the transfer formation process.

A plurality of deep contact holes are formed by etching the first insulation layer 503 and the second substrate 500. At this time, a diameter of each of the contact holes ranges from approximately 1 µm to approximately 5 µm, and a depth of each of the contact holes ranges from approximately 5 µm to approximately 50 µm.

Tungsten (W) is mainly used for forming connection units filling the deep contact holes. An insulation liner is formed in a thickness ranging from approximately 100 Å to approximately 3,000 Å to make a nitride layer and an oxide layer have a step coverage equal to or more than approximately 30%, respectively.

Meanwhile, Ti, TiN, TiW, and a combination thereof can be formed in a thickness ranging from approximately 100 Å to approximately 1,000 Å as a liner. Herein, the liner is not shown.

W is formed in a thickness ranging from approximately 0.1 µm to approximately 1.5 µm on the liner, and a chemical mechanical polishing (CMP) process is performed, thereby forming a planarized second connection unit 504B.

At this time, a plurality of first connection units 504A are formed in portions requiring an electrical connection such as the impurity regions 502 and the gate electrodes 501 by selectively etching the first insulation layer 503.

A plurality of Cu bonding pads 506A to 506C electrically connected to the first connection units 504A and the second connection unit 504B and connected to a photo detection device are formed to be surrounded by a second insulation layer 505 on the first connection units 504A and the second connection unit 504B.

The Cu bonding pads 506A to 506C are formed in a thickness ranging from approximately 0.3 µm to approximately 2.0 µm.

The Cu bonding pads 506A to 506C are formed through a damascene process or a typical lithography process.

It is preferable to recess a predetermined portion of the second insulation layer 505 to make a subsequent junction easily. At this time, it is preferable that a recessed depth ranges from approximately 0.1 µm to approximately 1.0 µm, and a dry recessing process or a wet recessing process can be used.

Through FIG. 4B, the fabrication process of the peripheral circuit unit before the three-dimensional integration is completed.

Figure 4C:
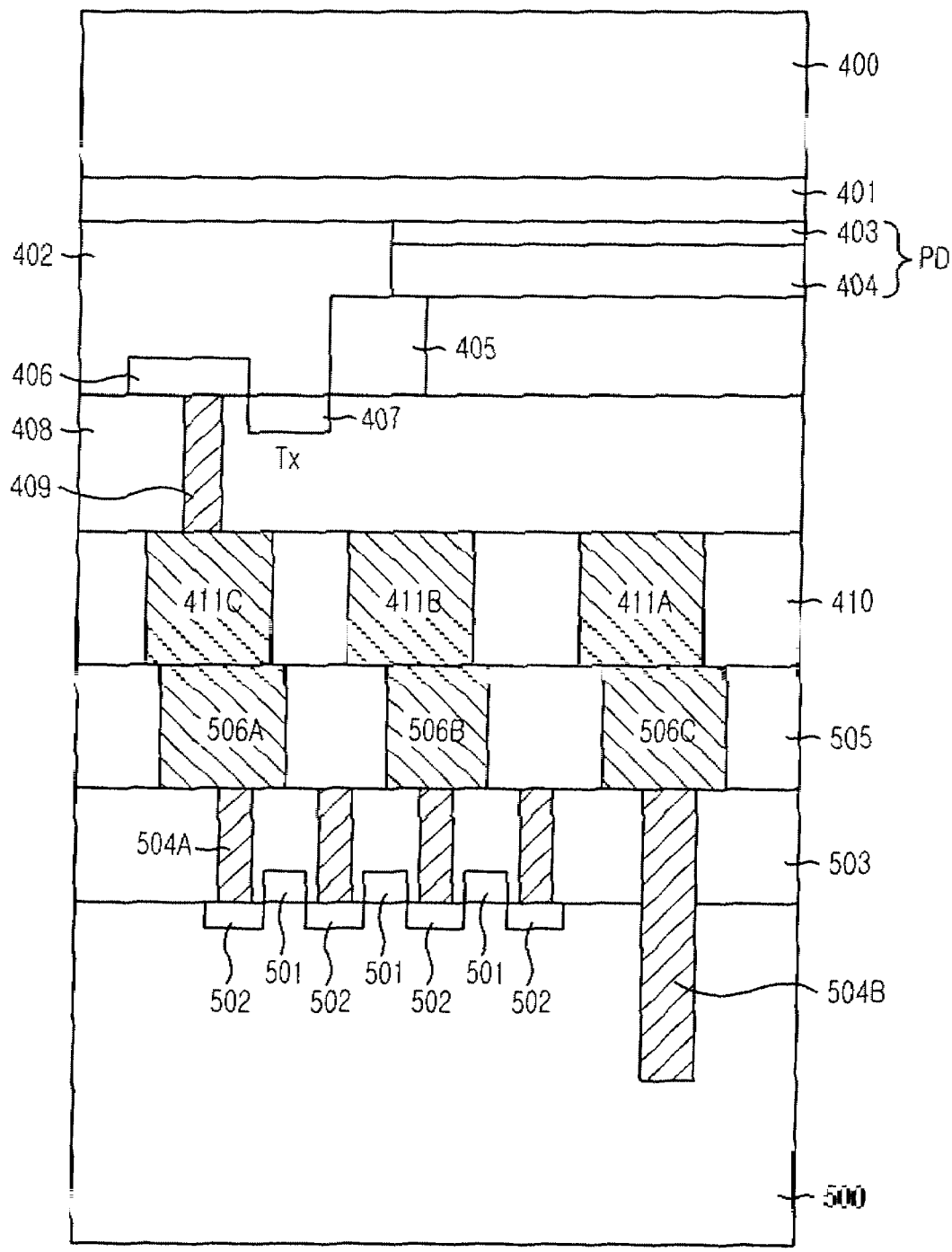

As shown in FIG. 4C, the first substrate 400 in which the photo detection device is formed and the second substrate 500 in which the peripheral circuit unit is formed are bonded to be faced with each other.

At this time, the Cu bonding pads 411A to 411C corresponds to the Cu bonding pads 506A to 506C, respectively. Afterwards, the Cu bonding pads 411A to 411C and 506A to 506C are subjected to a thermal treatment. Thus, a junction between the first substrate 400 and the second substrate 500 is carried out.

An image sensor capable of overcoming a decrease in photo sensitivity resulted from using a single crystal silicon substrate, and a method for fabricating the same. When the first substrate 400 and the second substrate 500 are bonded with each other, a back side of the first substrate 400 is turned upside down. It is because a photodiode PD is placed in the back side of the first substrate 400 and a microlens is formed thereon.

Figure 4D:
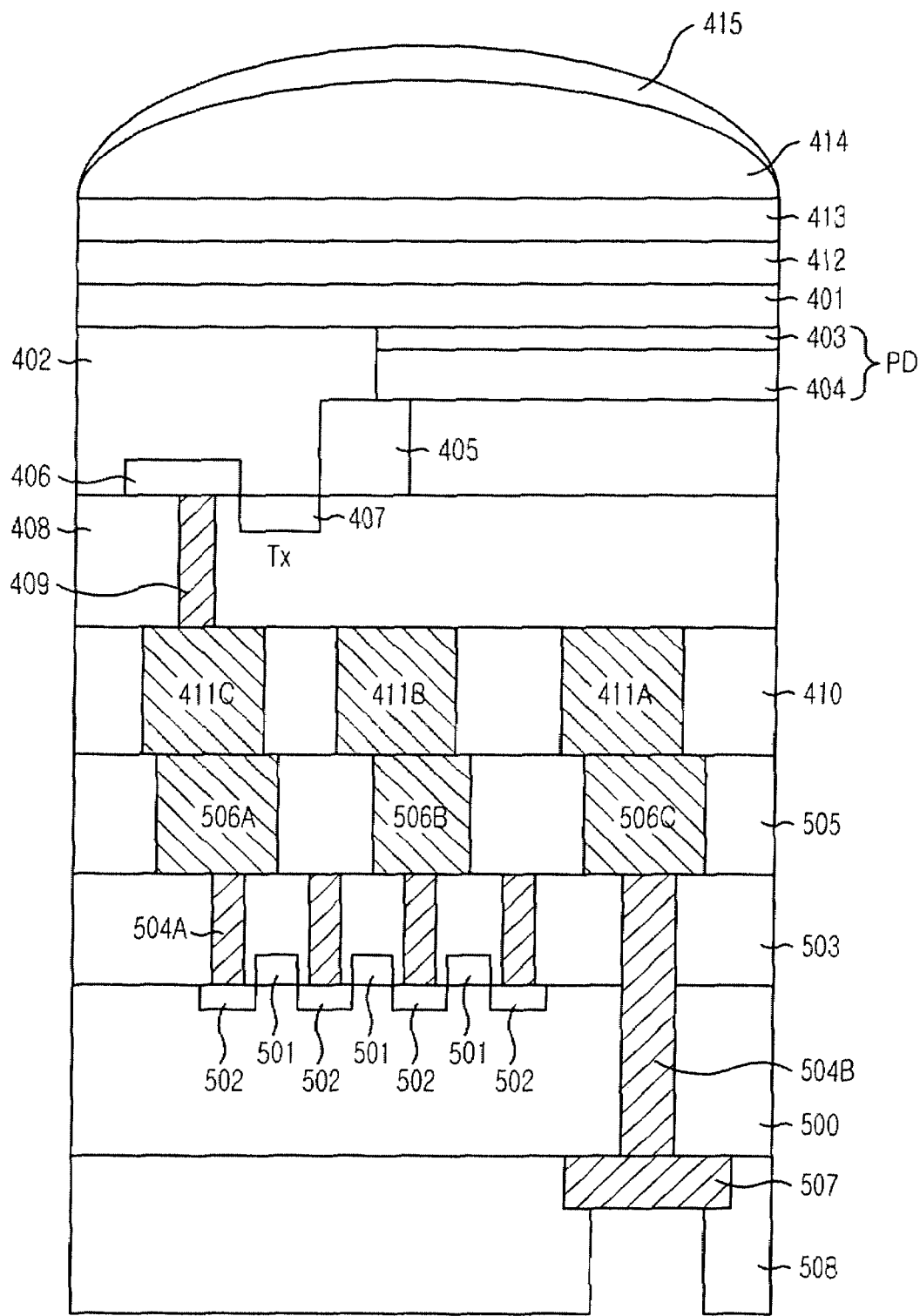

As shown in FIG. 4D, a back side of the second substrate 500 is partially removed, thereby exposing the second connection unit 504B. At this time, an etch target thickness of the second substrate 500 is controlled in a range which the second substrate 500 remains in a thickness ranging from approximately 5 µm to approximately 50 µm.

At this time, a mechanical grinding process or a CMP process can be used. An input/output pad 507 is formed to be connected to the exposed second connection unit 504B. Afterwards, an upper portion of the input/output pad 507 is opened and other portions of the input/output pad 507 are surrounded by a passivation layer 508.

Next, the back side of the first substrate 400 is removed and thus, the first insulation layer 401 is exposed. At this time, a physical grinding process or a wet etching process is used.

A planarization degree and a layer thickness of the first insulation layer 401 are not increased by more than ±10% from a uniformity degree of the first substrate 400 initially formed in the SOI structure.

A color filter array (CFA) 412 is formed on the first insulation layer 401 and then, an over coating layer 413 is formed on the color filter array (CFA) 412.

Next, if a photoresist layer is deposited and a thermal process is employed, a microlens (ML) 414 with a convex type is formed due to a surface tension of the photoresist layer as the photoresist layer is melted.

A lens passivation layer 415 is formed on the microlens (ML) 414. Since there is a deformation of the microlens (ML) 414 during a high thermal process, the lens passivation layer 415 is formed by using a low temperature oxide (LTO) layer. The LTO layer is formed in a temperature equal to or less than approximately 300° C.

Since the first insulation layer 401, the color filter array (CFA) 412, and the over coating layer 413 exist between the photodiode PD and the microlens 414 without metal lines, it is possible to easily secure a focal distance and reduce a decrease in an amount of the light.

By packaging the input/output pad 507 of the second substrate 500 through a ball grid array (BGA) method or a typical packaging method, a fabrication process of an image sensor chip is completed.

As described above, a light property can be maximized since it is possible to embody an entire surface of an image sensor chip in a photo detection device by fabricating an image sensor in a three dimensional integration structure, and light efficiency can be increased by minimizing a decrease in an amount of the light as a distance between a microlens and a photodiode is decreased.

For instance, although a CMOS image sensor is exemplified in the specific embodiment of the present invention, it is possible to apply all types of image sensors including a photo detection device and a microlens in addition to the CMOS image sensor.

Furthermore, although an image sensor with a three dimensional integration structure of a wafer level is embodied in the specific embodiment of the present invention, it is possible to apply a three dimensional integration structure of a wafer level through a junction of an insulation layer, a multi stacked structure between chips, a multi stacked structure between a chip and a wafer, or a system in package (SIP) method.

In accordance with the specific embodiment of the present invention, it is possible to obtain an effect in greatly increasing a capability of an image sensor by securing a whole chip area as a photo detection area and increasing light efficiency as decreasing a distance between a microlens and a photodiode.

The present application contains subject matter related to the Korean patent application No. KR 2004-0115972, filed in the Korean Patent Office on Dec. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor, comprising:
a photo detection device including a photodiode formed at a first end of said photo detection device, a first plurality of bonding pads formed on a second end of said photo detection device opposite said first end and a transfer transistor configured to transfer photoelectric charges produced by said photodiode, said transfer transistor having an electrode and being located between said photodiode and said first plurality of bonding pads such that said electrode of said transfer transistor being located below a plane defined by said photodiode; and
a peripheral circuits device including a second plurality of bonding pads formed on one end of said peripheral circuit device, said peripheral circuits device further including peripheral circuits formed on a substrate;
wherein said photo detection device is stacked on top of said peripheral circuits device such that ones of said first plurality of boding pads are electrically coupled to associated ones of said second plurality of bonding pads to provide electrical connection path between said photodiode and said peripheral circuits.

2. The image sensor of claim 1, wherein said peripheral circuits includes:
a plurality of transistors placed between said substrate and the second plurality of bonding pads;
one or more first connection units extending from the second plurality of bonding pads to at least one of said plurality of transistors;
an input/output pad disposed on an opposite end of said peripheral circuit device opposite from said end on which said second plurality bonding pads are disposed; and
at least one second connection unit extending through said substrate to form an electrical path between at least one of said second plurality of bonding pads and said input/output pad.

3. The image sensor of claim 2, wherein a diameter of each of the connection units ranges from approximately 1 μm to approximately 5 μm and a length of each of the connection units ranges from approximately 5 μm to approximately 50 μm.

4. The image sensor of claim 1, further comprising:
a microlens formed above said first end of said photo detection device;
a color filter array disposed between the photodiode and the microlens; and
an insulation layer formed with a silicon-on-insulation (SOI) structure, said insulation layer being disposed between said color filter array and said photodiode,
wherein one of impurity regions of the transfer transistors is directly connected to the photodiode.

5. The image sensor of claim 4, wherein:
the insulation layer is formed with an oxide based layer in a thickness ranging from approximately 0.3 μm to approximately 10 μm.

6. The image sensor of claim 1, wherein the first plurality and the second plurality of bonding pads are formed with copper (Cu).

7. The image sensor of claim 1, wherein the photodiode includes two different conductive regions whose PN junction is horizontally formed.

8. A method for fabricating an image sensor, comprising:
fabricating a photo detection device by:
forming a first insulation layer on a first substrate;
forming an epitaxial layer on the first insulation layer;
forming a photodiode within the epitaxial layer;
forming a transfer transistor within the epitaxial layer, an impurity region of the transfer transistor being directly connected to the photodiode; and
forming a plurality of first bonding pads above the transfer transistor;
fabricating a peripheral circuit device by:
forming a plurality of transistors on a second substrate;
forming a plurality of connection units extend from the second substrate away from said plurality of transistors, at least one of said plurality of connection units being made to penetrate through said second substrate; and
forming a plurality of second bonding pads at ends of the connection units;
stacking and bonding together the photo detection device and the peripheral device such that the first bonding pads and the second bonding pads face, and electrically coupled to, each other, and such that an electrode of said transfer transistor is located below a plane defined by said photodiode;

forming an input/output pad to be connected to the at least one of the plurality of connection units that penetrates said second substrate on a back side of the second substrate;

removing a back side of the first substrate to expose the first insulation layer;

forming a color filter array and an over coating layer on the first insulation layer; and forming a microlens on the over coating layer.

9. The method of claim 8, wherein the first insulation layer is formed with an oxide based layer in a thickness ranging from approximately 0.3 µm to approximately 10 µm.

10. The method of claim 8, wherein the first bonding pads and the second bonding pads are formed with copper (Cu).

11. The method of claim 8, wherein a diameter of each of the connection units ranges from approximately 1 m to approximately 5 µm, and a length of each of the connection units ranges from approximately 5 µm to approximately 50 µm.

12. The method of claim 10, wherein the bonding of the photo detection device and the peripheral circuit device is performed at a temperature ranging from approximately 300° C. to approximately 600° C.

13. The method of claim 8, wherein the forming of the input/output pad includes:

removing a portion of a back side of the second substrate to expose the at least one of the plurality of connection units; and forming the input/output pad in electrical connection with the exposed at least one of the plurality of connection units.

14. The method of claim 13, wherein during the removing of the portion of the back side of the second substrate, the second substrate remains in a thickness ranging from approximately 5 µm to approximately 50 µm.

15. The method of claim 13, wherein during the removing of the portion of the back side of the second substrate, one of a mechanical grinding process and a chemical mechanical polishing (CMP) process is used.

16. The method of claim 8, wherein the forming of the second bonding pads includes:

forming a second insulation layer over the connection units;

exposing the connection units by selectively etching the second insulation layer; and forming the second bonding pads, wherein the second bonding pads are planarized with the second insulation layer and connected to the exposed connection units.

17. The method of claim 16, wherein the forming of the second bonding pads further includes recessing the second insulation layer to a thickness ranging from approximately 0.1 µm to approximately 1 µm after forming of the second insulation layer.

18. The method of claim 8, wherein the photodiode is formed with two different conductive regions whose PN junction is horizontally formed.

* * * * *